United States Patent
Woo et al.

(10) Patent No.: US 7,449,934 B2
(45) Date of Patent: Nov. 11, 2008

(54) CMOS MIXER FOR USE IN DIRECT CONVERSION RECEIVER

(75) Inventors: Sang-Hyun Woo, Seoul (KR); Jin-Sung Park, Atlanta, GA (US); Chang-Ho Lee, Marietta, GA (US); Joy Laskar, Marietta, GA (US)

(73) Assignees: Samsung Electronics Co., Ltd. (KR); Georgia Tech Research Corporation, Atlanta, GA (US)

( * ) Notice: Subject to any disclaimer, the term of this patent is extended or adjusted under 35 U.S.C. 154(b) by 59 days.

(21) Appl. No.: 11/585,465

(22) Filed: Oct. 24, 2006

(65) Prior Publication Data

US 2007/0126491 A1 Jun. 7, 2007

Related U.S. Application Data

(60) Provisional application No. 60/742,769, filed on Dec. 6, 2005.

(30) Foreign Application Priority Data

Jun. 2, 2006 (KR) ...................... 10-2006-0050083

(51) Int. Cl.
 *G06F 7/44* (2006.01)
(52) U.S. Cl. ...................... 327/356; 327/359
(58) Field of Classification Search .................. 327/356, 327/359
 See application file for complete search history.

(56) References Cited

U.S. PATENT DOCUMENTS 6,947,720 B2 * 9/2005 Razavi et al. ............... 455/333
7,286,811 B2 * 10/2007 Kral ........................... 455/333
7,315,192 B2 * 1/2008 Chiu et al. .................. 327/359
2001/0021645 A1 * 9/2001 Ugajin et al. ............... 455/333
2003/0045263 A1 * 3/2003 Wakayama et al. ......... 455/323

OTHER PUBLICATIONS

Zhang et al., "A 900MHz CMOS Balanced Harmonic Mixer for Direct Conversion Receivers," IEEE Radio and Wireless Conference, 2000. pp. 219-222, Sep. 2000.
Darabi et al., "A Noise Cancellation Technique in Active-RF CMOS mixers." ISSCC, session 29, pp. 544-545, 2005.
Sjoland et al., "A Merged CMOS LNA and Mixer for a WCDMA Receiver," IEEE J. Solid State Circuits, vol. 38, No. 6, pp. 1045-1050, Jun. 2003.
Montagna et al., "A 72mW CMOS 802.11a Direct Conversion Receiver with 3.5dB NF and 200kHz l/f Noise Corner," Symposium on VLSI Circuits Dig. Oct., 2004.
Zhou et al., "A CMOS Passive Mixer with Low Flicker Noise for Low-Power Direct-Conversion Receiver," IEEE J. Solid State Circuits, vol. 40, No. 5, pp. 1084-1093, May 2005.

* cited by examiner

*Primary Examiner*—Kenneth B. Wells
(74) *Attorney, Agent, or Firm*—McNeely Bodendorf LLP

(57) ABSTRACT

Provided is a mixer for use in a direct conversion receiver. The mixer includes Field Effect Transistors (FETs), a current source (IBias), two load resistors (RLoad), another FET, and two inductors L1 and L2. The FET M21 constitutes a current bleeding circuitry and the other components except for the two inductors L1 and L2 constitute a so-called Gilbert cell mixer.

4 Claims, 8 Drawing Sheets

CMOS MIXER FOR USE IN DIRECT CONVERSION RECEIVER

PRIORITY

This application claims priority under 35 U.S.C. § 119 to an application entitled "CMOS Mixer for Use in Direct Conversion Receiver" filed in the United States Patent and Trademark Office on Dec. 6, 2005 and assigned Ser. No. 60/742,769, and an application filed in the Korean Intellectual Property Office on Jun. 2, 2006 and assigned Ser. No. 50083-2006, the contents of which are incorporated herein by reference.

BACKGROUND OF THE INVENTION

1. Field of the Invention

The present invention generally relates to a mixer of a communication system, and in particular, to a mixer for use in a direct conversion receiver.

2. Description of the Related Art

Generally, a mixer or a mixer circuit (hereinafter, collectively referred to as a "mixer") refers to a circuit for converting an input signal into a signal of a desired frequency band. The mixer is widely used in a transmitter and a receiver of a communication system and other various fields.

An example of a mixer is a mixer for use in a direct conversion receiver of a mobile communication system. The mixer mixes an input Radio Frequency (RF) signal with a signal from a Local Oscillator (LO) to output an Intermediate Frequency (IF) signal. The mixer is generally implemented with a Complementary Metal-Oxide Semiconductor (CMOS).

FIG. 1 illustrates the structure of a direct conversion receiver of a mobile communication system to which the present invention is applied.

Referring to FIG. 1, an antenna 10 receives a radio signal. A Band Pass Filter (BPF) 20 performs band pass filtering on a signal received by the antenna 10. A Low Noise Amplifier (LNA) 30 receives an RF signal that is band-pass filtered by the BPF 20 and performs low noise amplification on the received RF signal. A mixer 40 receives the RF signal that is low-noise amplified by the LNA 30 and mixes the RF signal with a LO signal applied from a LO (not shown) to generate a frequency-converted IF signal.

The mixer 40 shown in FIG. 1 can be implemented as a CMOS mixer as mentioned above. Main concerns in designing CMOS mixers are to improve conversion gain and linearity and reduce flicker noise. Flicker noise is inversely proportional to a frequency and typically occurs at a frequency less than several MHz in CMOS process. Flicker noise is also referred to as "1/f noise". To reduce flicker noise, CMOS mixers according to prior art are suggested as follows.

Zhang, Z.; Chen, Z.; Lau, J., "A 900 MHz CMOS Balanced Harmonic Mixer for Direct Conversion Receivers," IEEE Radio and Wireless Conference, 2000. pp. 219-222, September 2000, suggests a mixer with a static current bleeding circuitry, but it has the following disadvantages.

First, additional flicker noise occurs from the current bleeding circuitry.

Second, impedance (rds) viewed from a LO switch side increases due to very small LO switch current. Thus, some RF currents will flow into a PMOS bleeding circuitry instead of LO switching devices and conversion gain will decrease due to the diminished signal currents.

Third, some RF currents will be shunted out to the signal ground through parasitic capacitance.

Fourth, if the size of an LO switch increases high enough to reduce inherent flicker noise, parasitic capacitance will also increase and more RF currents will be shunted out to the signal ground.

Hooman Darabi, Janice Chiu, "A Noise Cancellation Technique in Active-RF CMOS mixers," ISSCC, session 29, pp. 544-545, 2005, suggests a mixer with a dynamic current bleeding circuitry, but it has the following disadvantages.

First, a voltage at the gate of dynamic current bleeding devices (PMOS) must be high enough to turn on and off the PMOS circuit.

Second, very high LO power is required to generate a high voltage at the gate nodes of the dynamic current bleeding devices (PMOS).

Third, since conversion gain is nearly 0 dB, there is no significant difference between the mixer and an passivemixer.

Fourth, noise voltages vary in LO+ switches or LO− switches. Actually, it is impossible to dynamically inject the same amount of current to LO+ switches or LO− switches at the same time. In particular, in the implementation of an I/Q mixer, synchronization is difficult to achieve.

H. Sjoland, Ali Karimi-Sanjaani, and A. A. Abidi, "A Merged CMOS LNA and Mixer for a WCDMA Receiver," IEEE J. Solid State Circuits, vol. 38, No. 6, pp. 1045-1050, June, 2003, suggests a mixer with one parallel connected inductor, but it has the following disadvantages.

First, due to the use of high LO currents, available headroom must be relatively narrow.

Second, the size of an inductor should be large, e.g., 10 nH, and Q of the inductor should be less than that of an inductor having a small size.

Third, it is effective to resonate tail capacitance to reduce flicker noise by an indirect mechanism instead of a direct mechanism.

G. Montagna, R. Castello et al., "A 72 mW CMOS 802.11a Direct Conversion Receiver with 3.5 dB NF and 200 kHz 1/f Noise Corner," Symposium on VLSI Circuits Dig. October, 2004, and Sining Zhou and Mau-Chung Frank Chang, "A CMOS Passive Mixer with Low Flicker Noise for Low-Power Direct-Conversion Receiver," IEEE J. Solid State Circuits, vol. 40, No. 5, pp. 1084-1093, May, 2005, suggest a mixer with passive implementation, but it has the following disadvantages.

First, a conversion gain is not good.

Second, an LNA gain required to minimize noise contribution from the base-band circuitry is very high.

Third, an LNA having a very high gain has a high tendency to oscillate.

Fourth, because of an LNA having a very high gain, a mixer having high linearity is required.

Fifth, since gain flatness over a frequency band is not good, the mixer is not suitable for a wideband applications.

SUMMARY OF THE INVENTION

It is, therefore, an aspect of the present invention to provide a mixer for solving the problems of the mixers occurring in the prior art.

According to one aspect of the present invention, there is provided a mixer including a first input and a second input for inputting a first signal, a third input and a fourth input for inputting a second signal, a first output and a second output for outputting a third signal, a first load resistor connected between a supply voltage and the first output, and a second load resistor connected between the supply voltage and the second output.

The mixer further includes a first transistor having a drain connected to the first output, a gate connected to the third input, and a source, a second transistor having a drain connected to the second output, a gate connected to the fourth input, and a source, a third transistor having a drain connected to the sources of the first transistor and the second transistor, a gate connected to the first input, and a source connected to a current source, a fourth transistor having a drain connected to the first output, a gate connected to the fourth input, and a source, a fifth transistor having a drain connected to the second output, a gate connected to the third input, and a source, a sixth transistor having a drain connected to the sources of the fourth transistor and the fifth transistor, a gate connected to the second input, and a source connected to the current source, a seventh transistor having a source (or drain) connected to a supply voltage, a gate connected to a voltage source, and a drain (or source) connected to the drain of the third transistor, and a eighth transistor having a source (or drain) connected to a supply voltage, a gate connected to a voltage source, and a drain (or source) connected to the drains of the sixth transistor. Two inductors may be inserted between the drains (or sources) of the seventh transistor and the eighth transistor, and the drains of the third transistor and the sixth transistor. The first inductor is connected between the drain (or source) of the seventh transistor and the drain of the third transistor and the second inductor is connected between the drain (or source) of the eighth transistor and the drain of the sixth transistor, respectively. The seventh transistor and the eighth transistor can be implemented as one transistor.

According to another aspect of the present invention, there is provided a mixer for use in a direct conversion receiver. The mixer includes a first input (RF+) and a second input (RF−) for inputting a Radio Frequency (RF) signal, a third input (LO+) and a fourth input (LO−) for inputting a Local Oscillation (LO) signal, a first output (IF+) and a second output (IF−) for outputting an Intermediate Frequency (IF) signal, a first load resistor connected between a supply voltage (VDD) and the first output (IF+), and a second load resistor connected between the supply voltage (VDD) and the second output (IF−).

The mixer further includes a first transistor (M1) having a drain connected to the first output (IF+), a gate connected to the third input (LO+), and a source, a second transistor (M2) having a drain connected to the second output (IF−), a gate connected to the fourth input (LO+), and a source, a third transistor (M3) having a drain connected to the sources of the first transistor (M1) and the second transistor (M2), a gate connected to the first input (RF+), and a source connected to a current source (IBias$_{[T1]}$), a fourth transistor (M4) having a drain connected to the first output (IF+), a gate connected to the fourth input (LO−), and a source, a fifth transistor (M5) having a drain connected to the second output, a gate connected to the third input (LO+), and a source, a sixth transistor (M6) having a drain connected to the sources of the fourth transistor (M4) and the fifth transistor (M5), a gate connected to the second input (RF−), and a source connected to the current source (IBias), a seventh transistor (M7$_{[T1]}$) having a source (or drain) connected to a supply voltage (VDD), a gate connected to a voltage source (VBias), and a drain (or source) connected to the drain of the third transistor (M3), and a eighth transistor (M8$_{[T1]}$) having a source (or drain) connected to a supply voltage (VDD), a gate connected to a voltage source (VBias), and a drain (or source) connected to the drains of the sixth transistor (M6). Two inductors (L1,L2$_{[T1]}$) may be inserted between the drains (or sources) of the seventh transistor (M7) and the eighth transistor (M8), and the drains of the third transistor (M3) and the sixth transistor (M6). The first inductor (L1) is connected between the drain (or source) of the seventh transistor (M7) and the drain of the third transistor (M3) and the second inductor (L2) is connected between the drain (or source) of the eighth transistor (M8) and the drain of the sixth transistor (M6), respectively. The seventh transistor (M7) and the eighth transistor (M8) can be implemented as the one transistor$_{[T1]}$.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Preferred embodiments of the present invention will now be described in detail with reference to the annexed drawings. In the following description, a detailed description of known functions and configurations incorporated herein has been omitted for conciseness.

In designing the present invention the following facts to solve the problems of the mixers according to prior art have been taken into consideration:

(1) the current of an RF input terminal should be large for a good conversion gain;

(2) the current of an LO switching terminal should be low to lower the height of a pulse of flicker noise;

(3) the size of an LO switch should be large enough to reduce MOS-inherent flicker noise;

(4) if the size of an LO increases, parasitic capacitance Cp will also increase;

(5) if parasitic capacitance increases, flicker noise will also increase by an indirect mechanism; and (6) a small inductor size, a high inductor Q value, and a high inductor SRF are required.

When considering (1) and (2), a static current bleeding circuitry is used to reduce an LO switching current.

When considering (3), (4), and (5), two inductors are used to resonate parasitic capacitance Cp. These two inductors can increase a conversion gain because of being capable of preventing an RF current from flowing into a current bleeding circuitry, i.e., a PMOS.

When considering (6), two inductors are used having a small size. For example, each of the inductors may have a size of 3.3 nH.

Figure 2:
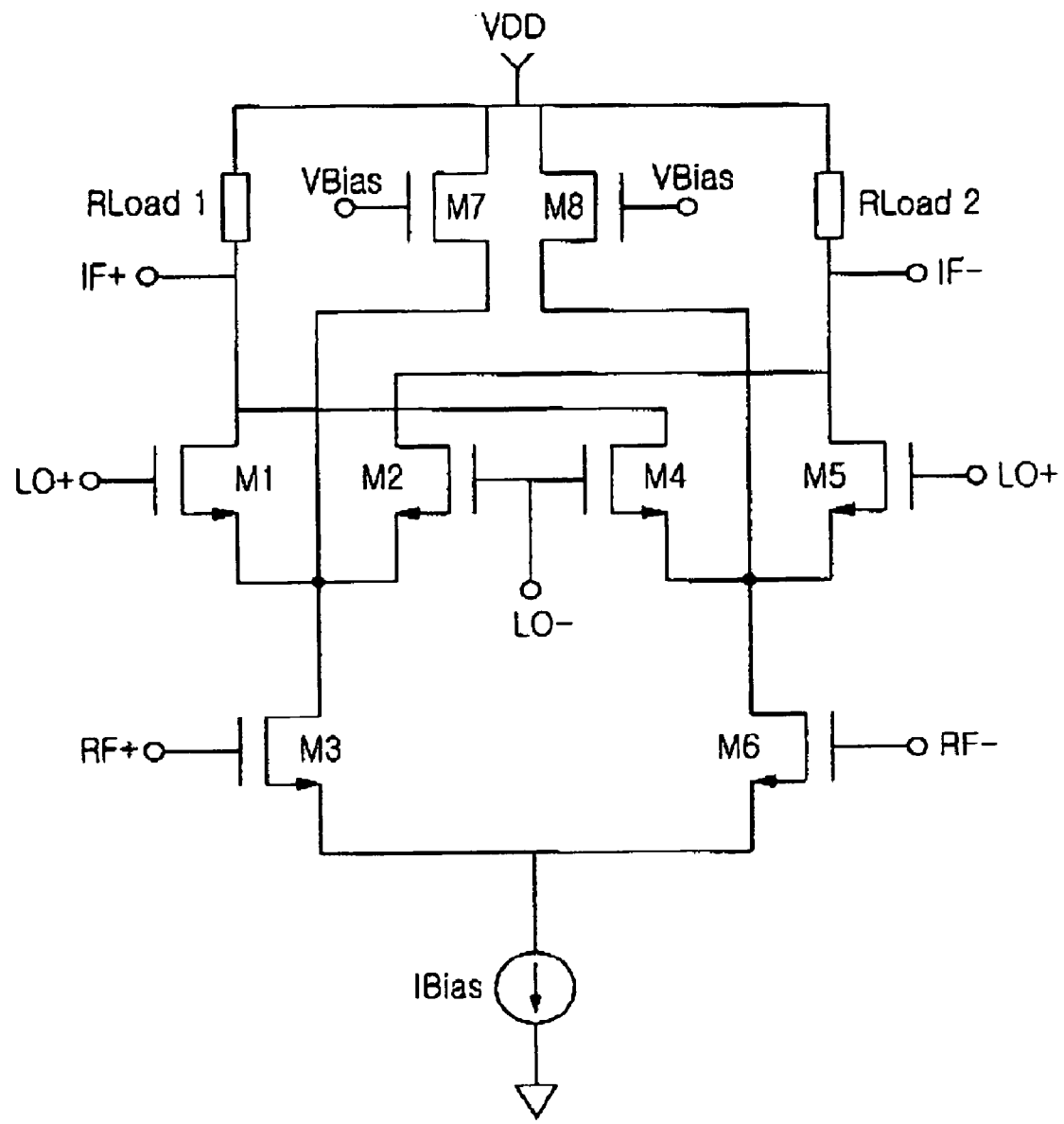
FIG. 2 is a circuit diagram of a mixer according to an embodiment of the present invention.

FIG. 2 is a circuit diagram of a mixer according to an embodiment of the present invention.

Referring to FIG. 2, the mixer of the present invention includes Field Effect Transistors (FETs) M1-M6, a current source IBias, two load resistors RLoad1, RLoad 2[, and other FETs M7 and M8. The FETs M7 and M8 constitute a current bleeding circuitry and the other components constitute a so-called Gilbert cell mixer.

Figure 1:
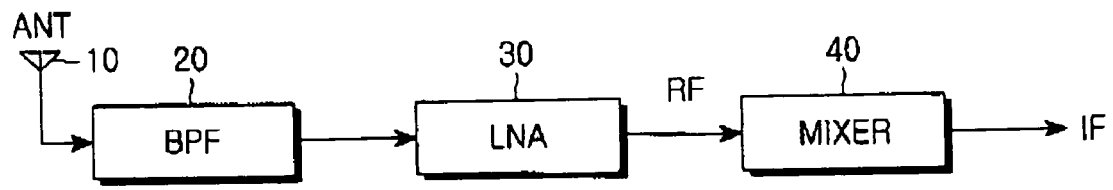
FIG. 1 illustrates the structure of a direct conversion receiver of a mobile communication system to which the present invention is applied.

This mixer may be, for example, the mixer 40 of a direct conversion receiver as shown in FIG. 1. In this case, the mixer is connected to an RF unit, i.e., the outputs RF+ and RF− of the BPF 20 and the LNA 30, inputs IF+ and IF− of an IF unit (not shown), and oscillating signal outputs LO+ and LO− of an LO (not shown). Thus, the mixer receives an RF signal as an input, mixes the input RF signal with a signal oscillated by the LO, and outputs a resulting IF signal.

Regarding FET M1, a gate is connected to a first output LO+ of the LO, a drain is connected to a side of the first load resistor Rload 1 and a first input IF+ of an IF unit, and a source is connected to a source of the FET M2 and a drain of the FET M3. Regarding FET M2, a gate is connected to a second output LO− of the LO and a gate of the FET M4, a drain is connected to a side of the second load resistor RLoad 2 and a second input IF− of the IF unit, and a source is connected to the source of the FET M1 and the drain of the FET M3. Regarding FET M3, a gate is connected to a first output RF+ of an RF unit, a drain is connected to the source of the FET M1 and the source of the FET M2, and a source is connected to a side of the current source IBias and a source of FET M6. The other side of the current source IBias is connected to ground.

Regarding FET M4, a gate is connected to the second output LO− of the LO and the gate of the FET M2, a drain is connected to a side of the first load resistor Rload 1 and the first input IF+ of the IF unit, and a source is connected to a source of the FET M5 and a drain of the FET M6. Regarding FET M5, a gate is connected to the first output LO+ of the LO, a drain is connected to a side of the second load resistor RLoad 2 and the second input IF− of the IF unit, and a source is connected to a source of the FET M4 and a drain of the FET M6. Regarding FET M6, a gate is connected to the second output RF− of the RF unit, a drain is connected to the source of the FET M4 and a source of the FET M5, and a source is connected to a side of the current source IBias and the source of FET M3.

FETs M1-M6 may be implemented as P-type MOS FETs.

Regarding first load resistor Rload 1, one side is connected to the first input IF+ of the IF unit and the drain of the FET M1 and the other side is connected to a supply voltage terminal VDD. Regarding second load resistor Rload 2, one side is connected to the second input IF− of the IF unit and the drain of the FET M5 and the other side is connected to the supply voltage terminal VDD.

Regarding FET M7, a gate is connected to a voltage source VBias, a source (or drain) is connected to the supply voltage terminal VDD, and a drain (or source) is connected to the sources of the FETs M1 and M2 and the drain of the FET M3. Regarding FET M8, a gate is connected to another voltage source VBias, a source (or drain) is connected to the supply voltage VDD, and a drain (or source) is connected to the sources of the FETs M4 and M5 and the drain of the FET M6.

Figure 3:
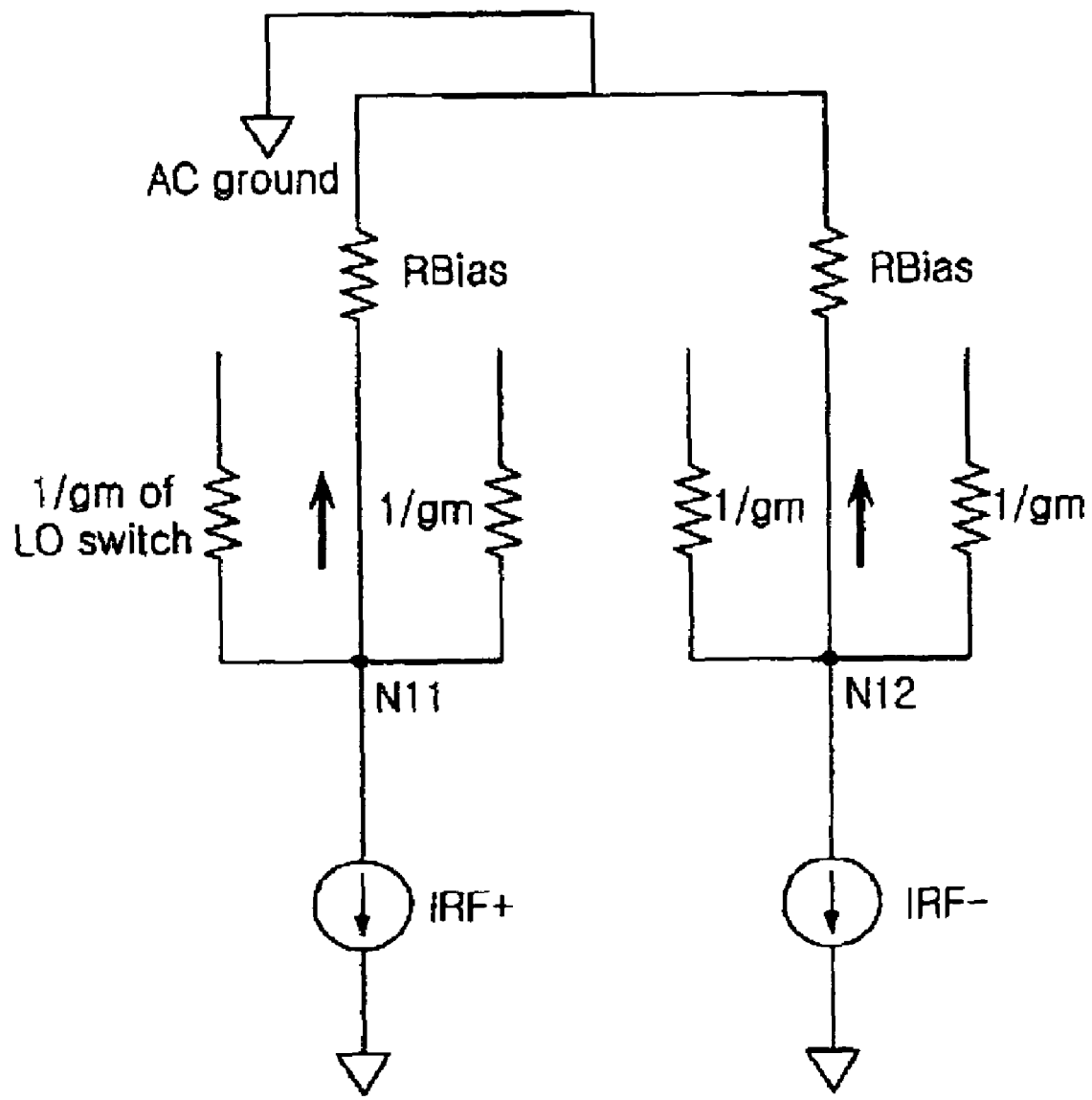
FIG. 3 is an equivalent circuit diagram of the mixer of FIG. 2 viewed from the RF unit of FIG. 1.

FIG. 3 is an equivalent circuit diagram of the mixer of FIG. 2 viewed from the RF unit of FIG. 1.

Referring to FIG. 3, to a node N11 is connected a side of a resistance component RBias of the FET M7, a side of a resistance component 1/gm of the FET M1 that is switched in response to an oscillation signal from the LO, a side of a resistance component 1/gm of the FET M2, and a side of a current source IRF+ that is generated by switching of the FET M3 in response to an RF signal from the RF unit. The other side of the current source IRF+ and the other side of the resistance component RBias of the FET M7 are connected to ground. To a node N12 is connected a side of a resistance component RBias of the FET M8, a side of a resistance component 1/gm of the FET M5 that is switched in response to an oscillation signal from the LO, a side of a resistance component 1/gm of the FET M4, and a side of a current source IRF− that is generated by switching of the FET M6 in response to an RF signal from the RF unit. The other side of the current source IRF− and the other side of the resistance component RBias of the FET M8 are connected to ground.

In the mixer as shown in FIGS. 2 and 3, flicker noise, also referred to as 1/f noise, can be effectively removed by the current bleeding circuitry formed by the FETs M7 and M8 as described below.

In the mixer, flicker noise originates from the FETs M1 and M5. In other words, if a large amount of current flows through the sources of FETs M1 and M5, more flicker noise is generated. Thus, there is a need to ensure that only a small amount of current flows through the sources of the FETs M1 and M5.

To improve the conversion performance of the mixer, there is a need to ensure that a large amount of current flows through the FETs M3 and M6, i.e., the FETs M3 and M6 from the sources of the FETs M1 and M5.

In practice, the former need and the latter need are not compatible. However, in the present invention, by using the current bleeding circuitry, both the needs can be satisfied. In other words, the former need is satisfied by ensuring that a small amount of current flows through the sources of the FETs M1 and M5, and the latter need is satisfied by ensuring that a large amount of current flows through the current bleeding circuitry, i.e., the FETs M7 and M8 in order to ensure that a large amount of current flows through the FETs M3 and M6.

Figure 4:
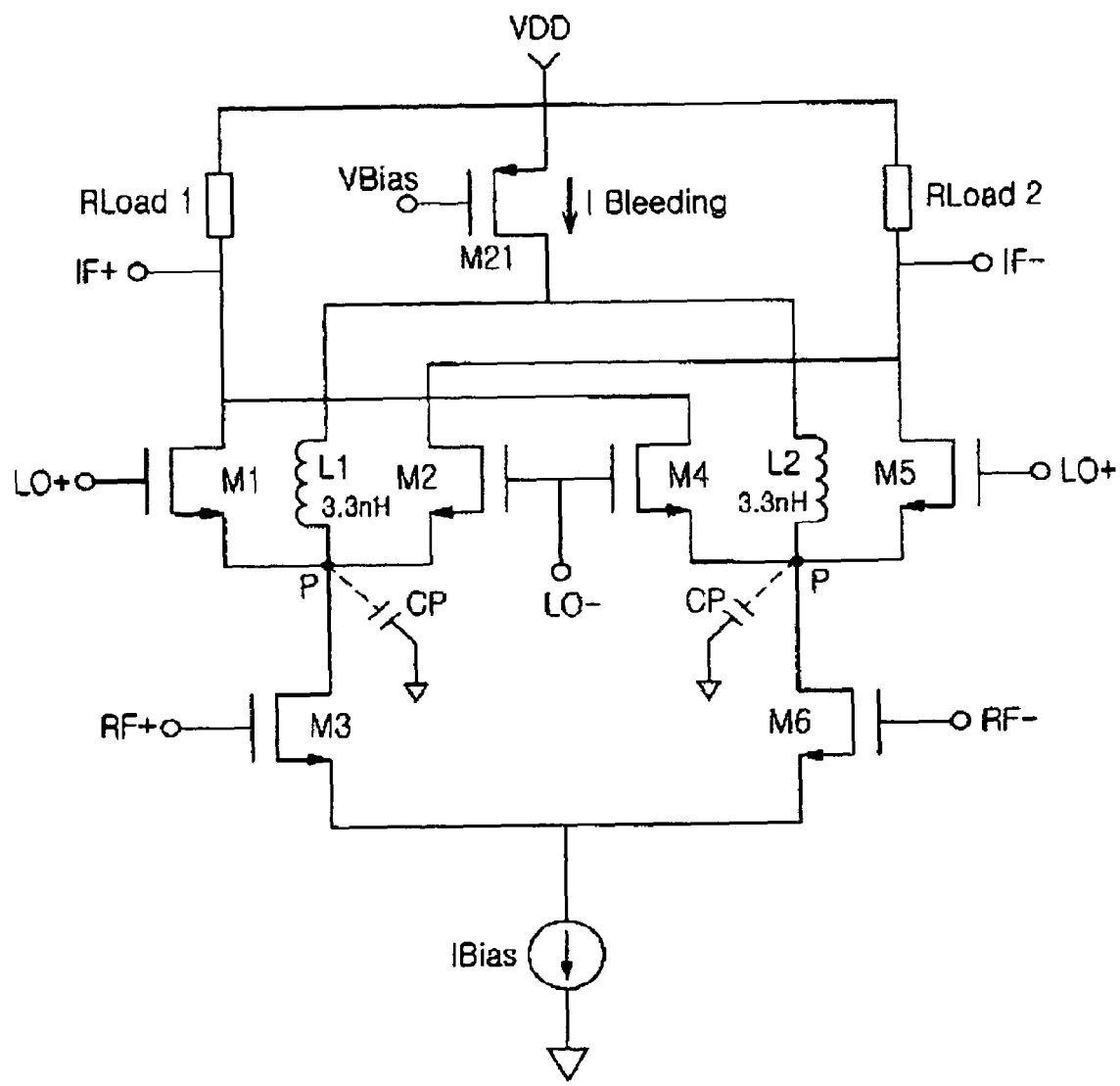
FIG. 4 is a circuit diagram of a mixer according to an embodiment of the present invention.

FIG. 4 is a circuit diagram of a mixer according to another embodiment of the present invention.

Referring to FIG. 4, the mixer includes FETs M1-M6, a current source IBias, two load resistors RLoad 1 and RLoad 2, FET M21, and two inductors L1 and L2. Although two capacitors Cp are shown in FIG. 4, they are not actually implemented in a circuit, but are parasitic capacitors Cp that are parasitic on the circuit. The FET M21 constitutes a current bleeding circuitry according to the present invention and the other components except for the inductors L1 and L2 constitute a so-called Gilbert cell mixer.

The mixer may be, for example, the mixer 40 of a direct conversion receiver as shown in FIG. 1. In this case, the mixer is connected to an RF unit, i.e., the outputs RF+ and RF− of the BPF 20 and the LNA 30, inputs IF+ and IF− of an IF unit (not shown), and oscillating signal outputs LO+ and LO− of an LO (not shown). Thus, the mixer receives an RF signal as an input, mixes the input RF signal with a signal oscillated by the LO, and outputs a resulting IF signal.

Regarding FET M1, a gate is connected to a first output terminal LO+ of the LO, a drain is connected to a side of the first load resistor Rload 1 and a first input IF+ of an IF unit, and a source is connected to a source of the FET M2 and a drain of the FET M3. A drain of the FET M4 is connected to the drain of the FET M1 and a side of the first inductor L1 is connected to the source of the FET M1. Regarding FET M2, a gate is connected to a second output LO− of the LO and a gate of the FET M4, a drain is connected to a side of the second load resistor RLoad 2 and a second input IF− of the IF unit, and a source is connected to the source of the FET M1 and the drain of the FET M3. A side of the first inductor L1 is connected to the source of the FET M2. Regarding FET M3, a gate is connected to a first output RF+ of an RF unit, a drain is connected to the source of the FET M1, the source of the FET M2, and a side of the first inductor L1, and a source is connected to a side of the current source IBias. The other side of the current source IBias is connected to ground.

Regarding FET M4, a gate is connected to the second output LO− of the LO and the gate of the FET M2, a drain is connected to a side of the first load resistor Rload 1 and the first input IF+ of the IF unit, and a source is connected to a source of the FET M5, a drain of the FET M6, and a side of the second inductor L2. Regarding FET M5, a gate is connected to the first output LO+ of the LO, a drain is connected to a side of the second load resistor RLoad 2 and the second input IF− of the IF unit, and a source is connected to a source of the FET M4, a drain of the FET M6, and a side of the second inductor L2. Regarding FET M6, a gate is connected to the second output RF− of the RF unit, a drain is connected to the source of the FET M4, a source of the FET M5, and a side of the second inductor L2, and a source is connected to a side of the current source IBias and the drain of FET M3.

Regarding the first load resistor Rload 1, one side is connected to the first input IF+ of the IF unit and the drain of the FET M1 and the other side is connected to a supply voltage terminal VDD. Regarding second load resistor Rload 2, one side is connected to the second input IF− of the IF unit and the drain of the FET M5 and the other side is connected to the supply voltage terminal VDD.

Regarding FET M21, a gate is connected to a voltage source VBias, a source is connected to the supply voltage VDD, and a drain is connected to the other side of the first inductor L1 and the other side of the second inductor L2. For a small size, a high Q value, and a high SRF value, the first inductor L1 and the second inductor L2 may have a size of 3.3 nH.

Figure 5:
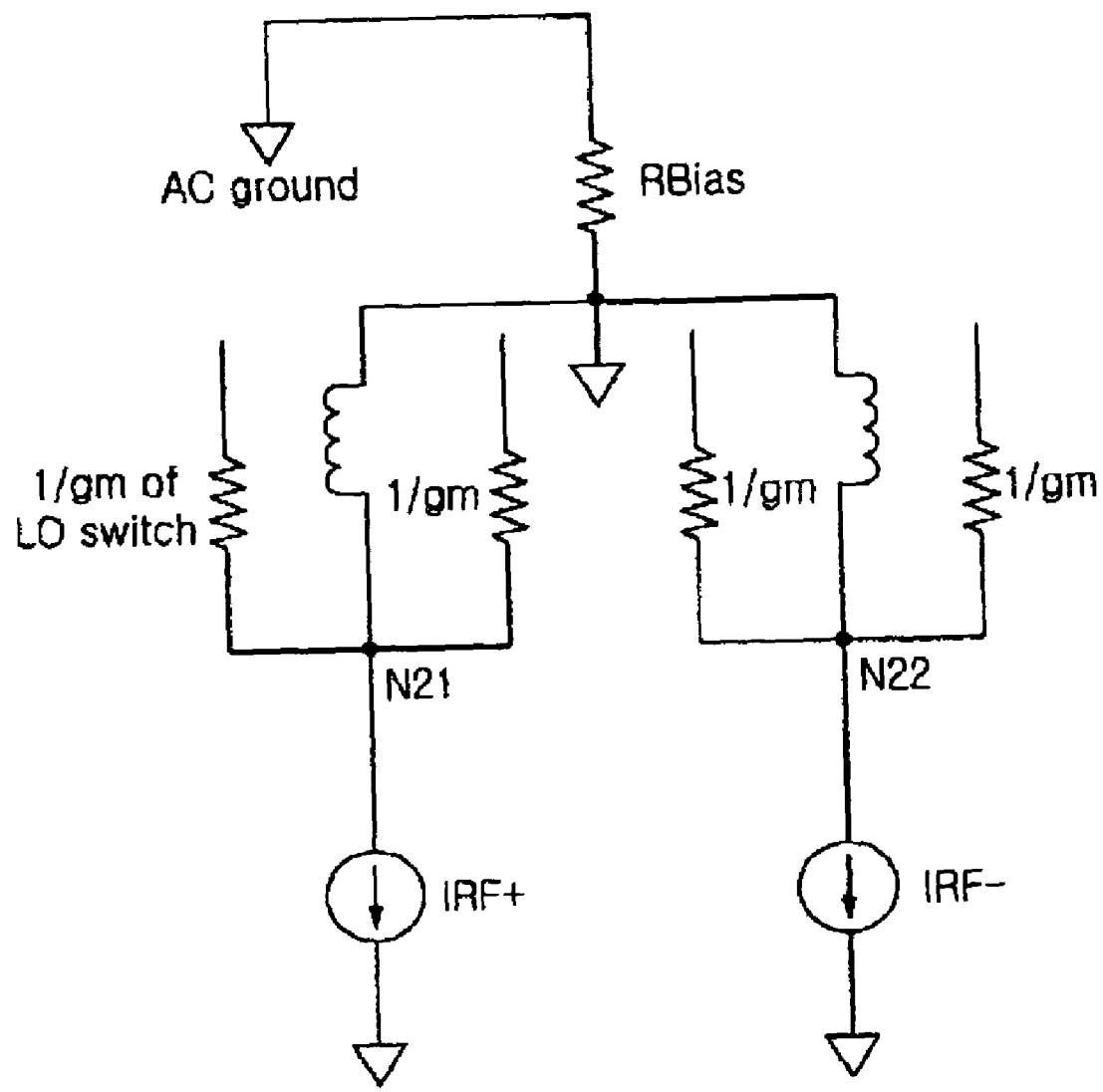
FIG. 5 is an equivalent circuit diagram of the mixer of FIG. 4 viewed from the RF unit of FIG. 1.

FIG. 5 is an equivalent circuit diagram of the mixer of FIG. 4 viewed from the RF unit of FIG. 1.

Referring to FIG. 5, to a node N21 is connected a side of a resistance component RBias of the FET M21, a side of a resistance component 1/gm of the FET M1 that is switched in response to an oscillation signal from the LO, a side of a resistance component 1/gm of the FET M2, and a side of a current source IRF+ that is generated by switching of the FET M3 in response to an RF signal from the RF unit. The other side of the current source IRF+ and the other side of the resistance component RBias of the FET M21 are connected to ground. To a node N22 is connected a side of a resistance component RBias of the FET M21, a side of a resistance component 1/gm of the FET M5 that is switched in response to an oscillation signal from the LO, a side of a resistance component 1/gm of the FET M4, and a side of a current source IRF− that is generated by switching of the FET M6 in response to an RF signal from the RF unit. The other side of the current source IRF− and the other side of the resistance component RBias of the FET M21 are connected to ground.

In the mixer as shown in FIGS. 4 and 5, flicker noise can be effectively removed by the current bleeding circuitry formed by the FET M21 as described below.

In the mixer, flicker noise originates from the FETs M1 and M5. In other words, if a large amount of current flows through the sources of the FETs M1 and M5, more flicker noise is generated. Thus, there is a need to ensure that a small amount of current flows through the sources of the FETs M1 and M5.

To improve the conversion performance of the mixer, there is a need to ensure that a large amount of current flows through the FETs M3 and M6, i.e., the FETs M3 and M6 from the drains of the FETs M1 and M5.

In practice, the former need and the latter need are not compatible. However, in the present invention, by using the current bleeding circuitry, both the needs can be satisfied. In other words, the former need is satisfied by ensuring that a small amount of current flows through the drains of the FETs M1 and M5, and the latter need is satisfied by ensuring that a large amount of current flows through the current bleeding circuitry, i.e., the FET M21 in order to ensure that a large amount of current flows through the FETs M3 and M6.

The mixer as shown in FIGS. 4 and 5 according to the present invention can effectively remove flicker noise using the current bleeding circuitry and improve signal conversion performance. The signal conversion performance is improved by the use of the two inductors L1 and L2.

In the mixer, improvement of signal conversion performance means that more input RF signals are supplied to an LO side, i.e., the FETs M1 and M5. However, RF signals input through the FETs M3 and M6 are provided to the current bleeding circuitry M21 as well as the FETs M1 and M5. If so, signal conversion performance is degraded, which can be avoided by the use of the two inductors L1 and L2. Each of the inductors L1 and L2 form an LC parallel circuit with a parasitic capacitor, i.e., tail capacitor Cp. Thus, the LC parallel circuit prevents the RF signal input through the FETs M3 and M6 from being provided to the current bleeding circuitry M21 and the input RF signal is provided only to the FETs M1 and M5.

Figure 6:
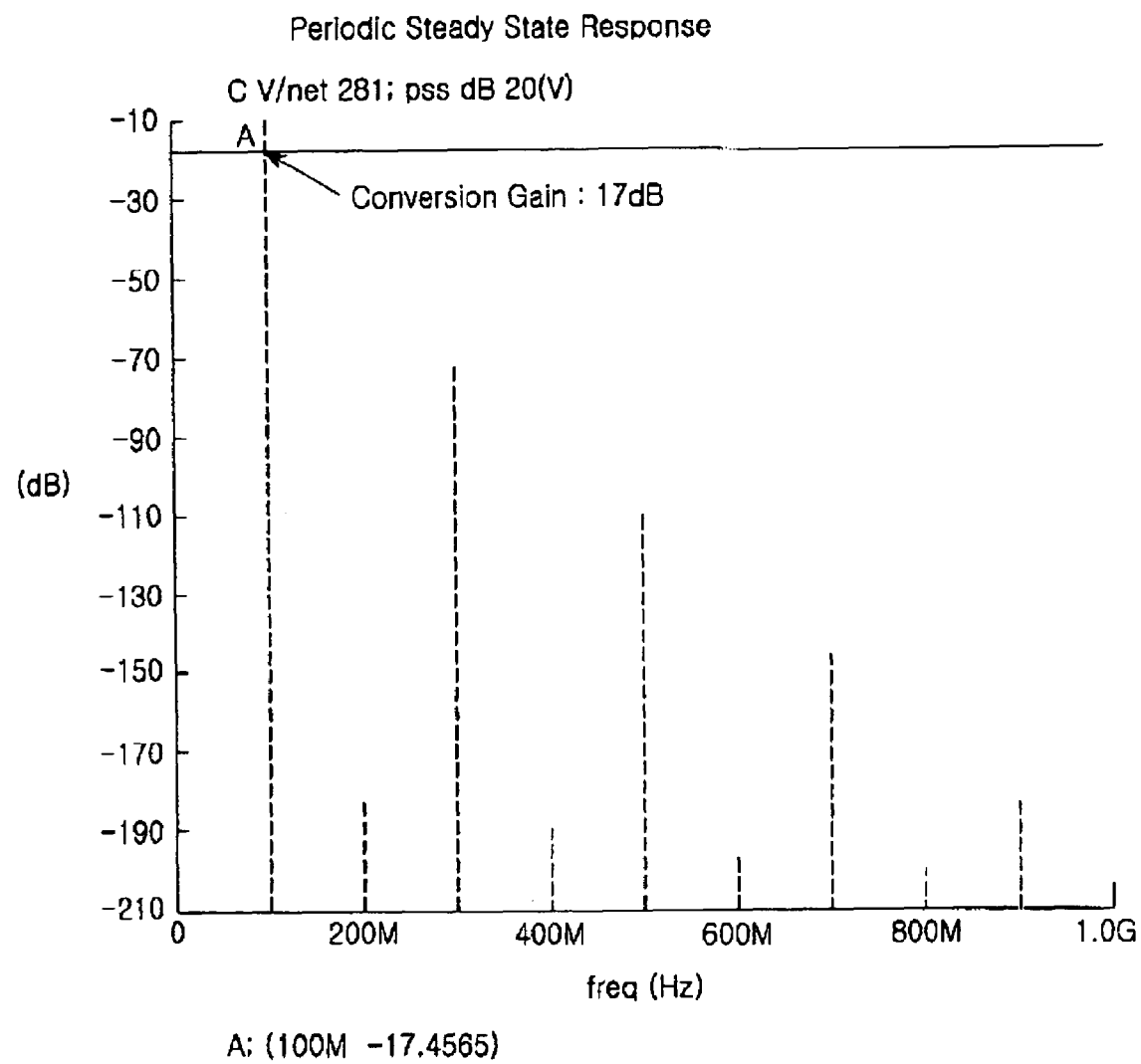
FIG. 6 is a graph showing the conversion gain of the mixer according to the present invention.

FIG. 6 is a graph showing the conversion gain of the mixer according to the present invention.

Referring to FIG. 6, the mixer including two inductors according to the present invention has a signal conversion gain of 17 dB.

Figure 7A:
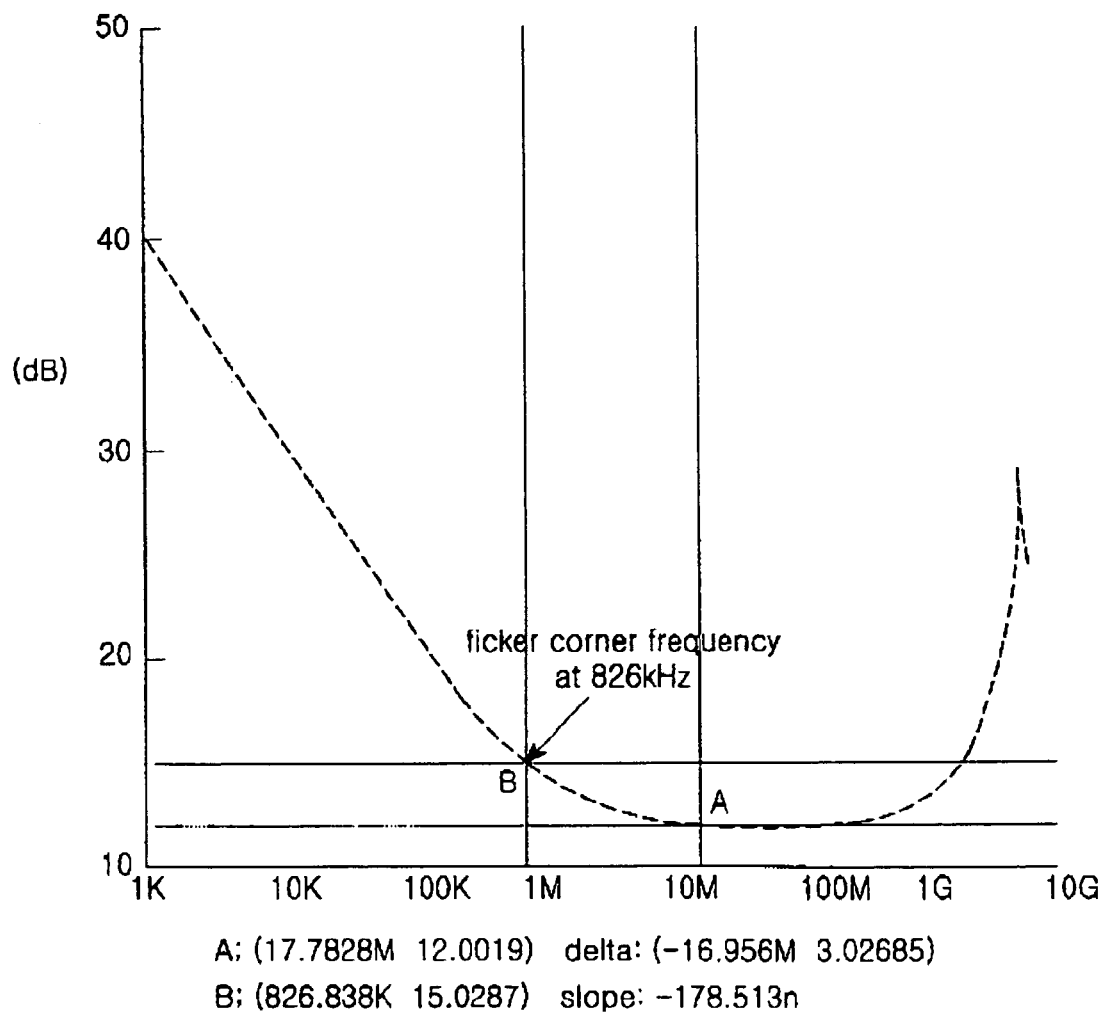
FIG. 7A is a graph showing the flicker corner frequency of the mixer according to the present invention.
Figure 7B:
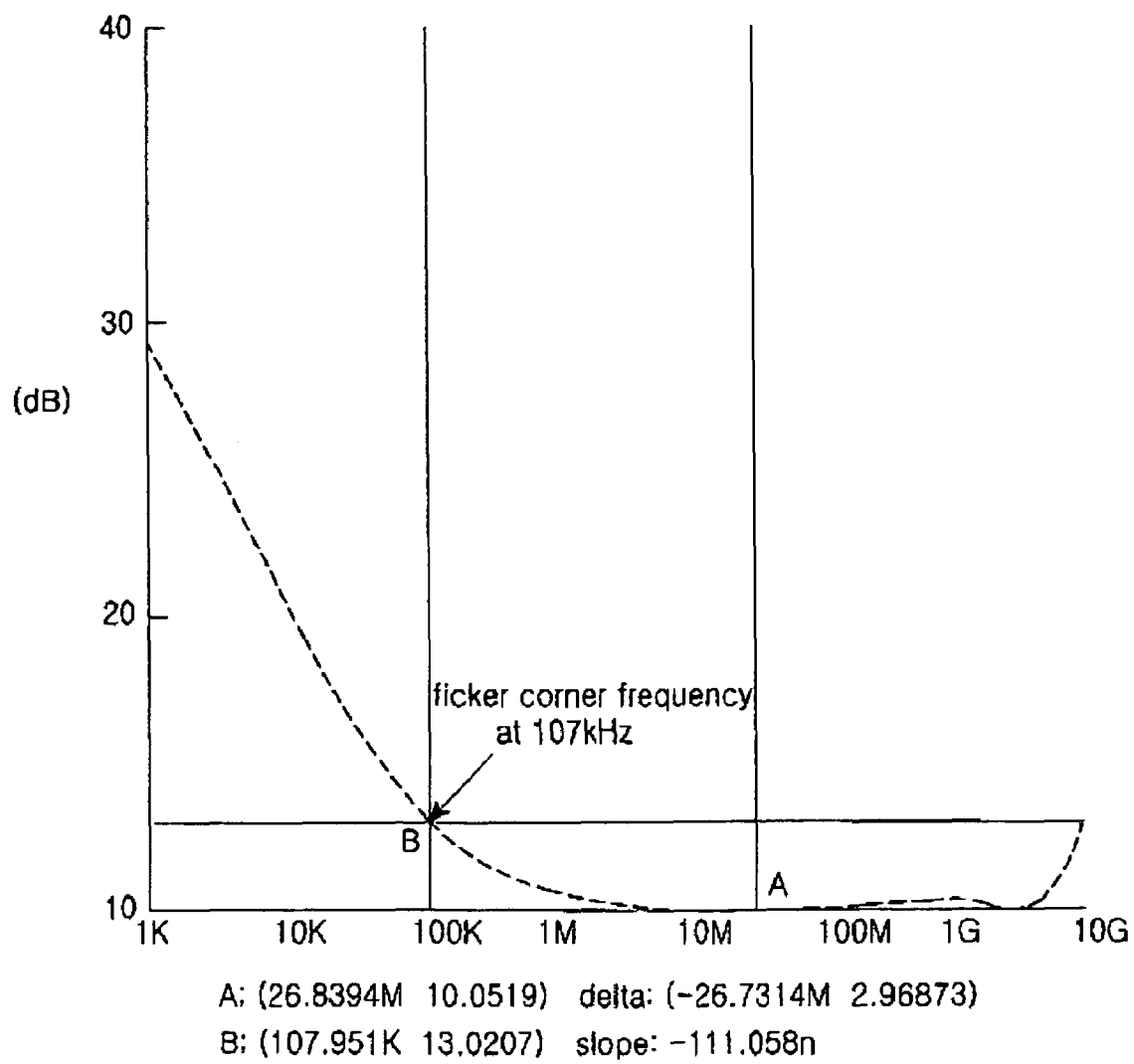
FIG. 7B is a graph showing the flicker corner frequency of the mixer according to the present invention.

FIG. 7A is a graph showing the flicker corner frequency of the mixer according to the first embodiment of the present invention and FIG. 7B is a graph showing the flicker corner frequency of the mixer according to the second embodiment of the present invention.

Referring to FIGS. 7A and 7B, the mixer according to the first embodiment of the present invention has a flicker corner frequency of 826 kHz, whereas the mixer according to the second embodiment of the present invention has a flicker corner frequency of 107 kHz which is reduced by 719 kHz from that of the mixer according to the first embodiment of the present invention.

The following tables show simulation results with respect to the mixers according to the present invention. As can be appreciated from the tables, as the amount of current flowing through the current bleeding circuits of the mixers, flicker noise, i.e., flicker corner frequency, is reduced. For example, in Table 1A, if a 3.52 mA current flows through a current bleeding circuit, flicker noise is 167 kHz, and if a 3.76 mA current flows through a current bleeding circuit, flicker noise is 107 kHz. As another example, in Table 1B, if a 3.52 mA current flows through a current bleeding circuit, flicker noise is 1.34 MHz, and if a 3.76 mA current flows through a current bleeding circuit, flicker noise is 826 kHz.

TABLE 1A

| Second embodiment; Static current bleeding with two inductors | | | | | |
|---|---|---|---|---|---|
| Bleeding Current (mA) | LO SW Current (mA) | NF (dB) | Corner Frequency (Hz) | Gain (dB) | IIP3 (dBm) |
| 3.76 | 60 | 10.1 | 107k | 17 | −8.2 |
| 3.64 | 90 | 10.0 | 134k | 17.8 | −7.1 |
| 3.52 | 120 | 10.2 | 167k | 18.5 | −6.2 |

TABLE 1B

First embodiment; Static current bleeding without inductors

| Bleeding Current (mA) | LO SW Current (mA) | NF (dB) | Corner Frequency (Hz) | Gain (dB) | IIP3 (dBm) |
|---|---|---|---|---|---|
| 3.76 | 60 | 12.1 | 826k | 13 | −7.4 |
| 3.64 | 90 | 12.2 | 1.20M | 13.1 | −5.6 |
| 3.52 | 120 | 12.1 | 1.34M | 14.7 | −4.3 |

The following table shows a simulation result used in the mixer according to the second embodiment of the present invention.

TABLE 2

| RF Frequency | 5.2 GHz |
|---|---|
| LO Frequency | 5.2 GHz |
| Conversion Gain | 17 dB |
| Noise Figure | 10 dB |
| IIP3 | −7.89 dBm |
| P1dB | −17.82 dBm |
| Flicker Corner Frequency | 107 kHz |
| Total Power Consumption | 7.2 mW (4 mA, 1.8 V) |

Referring to Table 2, an RF frequency and an LO frequency are 5.2 GHz, respectively, a conversion gain is 17 dB, a noise figure is 10 dB, Input Intercept Point 3(IIP3) is −7.89 dBm, P1dB is −17.82 dBm, a flicker corner frequency is 107 kHz, and total power consumption is 7.2 mW.

The following table shows comparison among the performances of the mixers according to prior art and the mixer according to the second embodiment of the present invention.

TABLE 3

| Topology | Prior Art 1 | Prior Art 2 | Prior Art 3 | Prior Art 4 | Present Invention |
|---|---|---|---|---|---|
| Gain/Loss | moderate conversion gain | poor conversion gain | moderate conversion gain | conversion loss | good conversion gain |
| LO Power | moderate | very high | high | moderate | low |
| Linearity (IIP3) | moderate | good | moderate | moderate | moderate |
| Noise Figure | moderate | moderate | moderate | good | moderate |
| Flicker Corner Frequency | moderate | good | moderate | very good | very good |
| Power Consumption | moderate | very good | moderate | good | good |
| RF Frequency | 900 MHz | 2 GHz | 2.1 GHz | 5 GHz | 5.2 GHz |

Referring to Table 3, it can be seen that the mixer according to the second embodiment of the present invention has improved signal conversion gain, low LO power, and improved flicker noise when compared to prior art.

As mentioned above, the mixer according to the second embodiment of the present invention has superior performance in terms of flicker noise improvement, signal conversion, and power consumption. The performance of the mixer according to the second embodiment of the present invention can be summarized as follows.

First, the mixer can reduce the amount of current flowing through an LO switch by using a static current bleeding method.

Second, the mixer can increase the size of the LO switch by using two inductors for resonation with a tail capacitor.

Third, the signal conversion gain of the mixer increases by 4 dB.

Fourth, the flicker corner frequency of the mixer decreases by 719 kHz.

Fifth, the mixer improves IIP3 to −7.89 dBm and the flow of a 4 mA current with a supply of 1.8V is improved, i.e., the power consumption is improved to 7.2 mW.

As described above, according to the present invention, by using a current bleeding circuitry and two inductors, performance can be improved in terms of flicker noise improvement, signal conversion, and power consumption.

While the present invention has been shown and described with reference to preferred embodiments thereof, it will be understood by those skilled in the art that various changes in form and details may be made therein without departing from the spirit and scope of the invention.

What is claimed is:

1. A mixer, comprising:
   a first input and a second input for inputting a first signal;
   a third input and a fourth input for inputting a second signal;
   a first output and a second output for outputting a third signal;
   a first load resistor connected between a supply voltage and the first output;
   a second load resistor connected between the supply voltage and the second output;
   a first transistor having a drain connected to the first output, a gate connected to the third input, and a source;
   a second transistor having a drain connected to the second output, a gate connected to the fourth input, and a source;
   a third transistor having a drain connected to the sources of the first transistor and the second transistor, a gate connected to the first input, and a source connected to a current source;
   a fourth transistor having a drain connected to the first output, a gate connected to the fourth input, and a source;
   a fifth transistor having a drain connected to the second output, a gate connected to the third input, and a source;
   a sixth transistor having a drain connected to the sources of the fourth transistor and the fifth transistor, a gate connected to the second input, and a source connected to the current source;
   a seventh transistor having a source connected to the supply voltage, a gate connected to a voltage source, and a drain connected to the drains of the third transistor and the sixth transistor;
   a first inductor connected between the drain of the seventh transistor and the drain of the third transistor; and
   a second inductor connected between the drain of the seventh transistor and the drain of the sixth transistor.

2. The mixer of claim 1, wherein each of the inductors has a size of 3.3 nH.

3. A mixer for use in a direct conversion receiver, the mixer comprising:
   a first input (RF+) and a second input (RF−) for inputting a Radio Frequency (RF) signal;
   a third input (LO+) and a fourth input (LO−) for inputting a Local Oscillation (LO) signal;
   a first output (IF+) and a second output (IF−) for outputting an Intermediate Frequency (IF) signal;
   a first load resistor connected between a supply voltage (VDD) and the first output (IF+);
   a second load resistor connected between the supply voltage (VDD) and the second output (IF−);
   a first transistor (M1) having a drain connected to the first output (IF+), a gate connected to the third input (LO+), and a source;

a second transistor (M2) having a drain connected to the second output (IF−), a gate connected to the fourth input (LO−), and a source;

a third transistor (M3) having a drain connected to the sources of the first transistor (M1) and the second (M2), a gate connected to the first input (RF+), and a source connected to a current source (IBias);

a fourth transistor (M4) having a drain connected to the first output (IF+), a gate connected to the fourth input (LO−), and a source;

a fifth transistor (M5) having a drain connected to the second output (IF−), a gate connected to the third input (LO+), and a source;

a sixth transistor (M6) having a drain connected to the sources of the fourth transistor (M4) and the fifth transistor (M5), a gate connected to the second input (RF−), and a source connected to the current source (IBias);

a seventh transistor (M21) having a source connected to the supply voltage (VDD), a gate connected to a voltage source (VBias), and a drain connected to the drains of the third transistor (M3) and the sixth transistor (M6); and a first inductor (L1) connected between the drain of the seventh transistor (M21) and the drain of the third transistor (M3); and a second inductor (L2) connected between the drain of the seventh transistor (M21) and the drain of the sixth transistor (M6).

4. The mixer of claim 3, wherein each of the inductors has a size of 3.3 nH.

* * * * *